United States Patent [19]
Vali et al.

[11] Patent Number: 5,210,779
[45] Date of Patent: May 11, 1993

[54] APPARATUS AND METHOD FOR FOCUSING HARD X-RAYS

[75] Inventors: Victor Vali, Laguna Hills; David B. Chang, Tustin; Albert F. Lawrence, San Diego, all of Calif.

[73] Assignee: Hughes Aircraft Company, Los Angeles, Calif.

[21] Appl. No.: 736,153

[22] Filed: Jul. 26, 1991

[51] Int. Cl.$^5$ .............................................. G06M 1/00
[52] U.S. Cl. ........................................ 378/84; 378/85; 378/34; 378/145
[58] Field of Search ...................... 378/84, 85, 70, 147, 378/145, 148, 149, 150, 158, 159, 34, 35, 73; 250/505.1, 363.10

[56] References Cited

U.S. PATENT DOCUMENTS

| | | | |
|---|---|---|---|
| 4,429,411 | 1/1984 | Smither | 378/84 |
| 4,987,582 | 1/1991 | Webster et al. | 378/70 |
| 5,063,586 | 11/1991 | Jewell et al. | 378/34 |

Primary Examiner—David P. Porta
Assistant Examiner—Don Wong
Attorney, Agent, or Firm—Michael W. Sales; Terje Gudmestad; Wanda K. Denson-Low

[57] ABSTRACT

A dislocation-free, composite-substance crystal having a lattice constant which decreases over the length of the crystal (38) convergently focuses beams of hard X-rays or gamma rays (11). A single-substance, dislocation-free crystal (34) collimates diffuse beams of hard X-rays or gamma rays and projects the collimated radiation (11') to the focusing crystal (38). A mask (36) is interposed between the collimating crystal (34) and the focusing crystal (38) causing the collimated radiation (11") to carry an image of the mask (36). The focusing crystal (38) produces a convergent hard X-ray beam or gamma ray beam (11''') to focus a reduced image of the mask (36) upon the photosensitive layer (41) of a wafer (39). An example of a dislocation-free crystal having a lattice constant which decreases over its length (38) is a dislocation-free silicon-germanium crystal (20) wherein the proportion of germanium to silicon varies over the length of the crystal.

17 Claims, 2 Drawing Sheets

APPARATUS AND METHOD FOR FOCUSING HARD X-RAYS

TECHNICAL FIELD OF THE INVENTION

The present invention relates to lithographic techniques for producing images of masks and, more particularly, to an apparatus and method for focusing hard X-rays and gamma rays to project a reduced image of a mask.

BACKGROUND OF THE INVENTION

One of the steps in producing integrated circuit semiconductor chips is to project the image defined by a mask onto the surface of a semiconductor wafer. In order to achieve greater miniaturization of the integrated circuits of these chips methods have been sought to project smaller mask images while maintaining sharp and precise circuit lines. To achieve this end, lithographic techniques progressed from the use of visible and ultra-violet electromagnetic energy to "soft X-rays." Soft X-rays occupy that portion of the electromagnetic spectrum just above ultra-violet energy. The shorter wavelength of soft X-rays makes possible the projection of smaller mask images.

Hard X-rays have shorter wavelengths than soft X-rays and occupy that portion of the electromagnetic spectrum above soft X-rays. Gamma rays have wavelengths shorter than hard X-rays and occupy that part of the electromagnetic spectrum above hard X-rays. Thus, it would be desirable to utilize hard X-rays and gamma rays to project mask images to produce more minute chip circuitry.

A problem in attempting to use these shorter-wavelength electromagnetic energies (hard X-rays and gamma rays) is that useful manipulation is difficult because of the shorter wavelengths and high electrical energies involved. Standard focusing mechanisms, such as lenses and prisms, are ineffective.

SUMMARY OF THE INVENTION

It is an object of the invention to provide a means for using hard X-rays and gamma rays to project a mask image onto a surface.

It is a further object of the invention to provide a means to collimate diffuse hard X-ray or gamma ray beams and convergently focus these collimated beams to project a reduced mask image.

The present invention teaches the use of a dislocation-free, composite-substance crystal having a lattice constant which decreases over the length of the crystal to convergently focus beams of hard X-rays or gamma rays. The invention also teaches the use of a dislocation-free, single-substance, crystal to collimate diffuse beams of hard X-rays or gamma rays and, in turn, to project the collimated radiation to the composite crystal. A mask is interposed between the "collimating crystal" and the "focusing crystal." The focusing crystal produces convergent hard X-rays or gamma rays to focus a reduced image of the mask upon a desired surface, namely, a wafer. The invention further teaches as a focusing crystal a substantially dislocation-free silicon-germanium crystal wherein the proportion of germanium to silicon varies over the length of the silicon germanium crystal from about 100 percent germanium to about 100 percent silicon.

Other aspects, objects, features, and advantages of the present invention will become apparent to those skilled in the art upon reading the detailed description of preferred embodiments in conjunction with the accompanying drawings and appended claims.

DETAILED DESCRIPTION OF PREFERRED EMBODIMENTS OF THE INVENTION

While the specification concludes with claims particularly pointing out and distinctly claiming the subject matter which is regarded as the present invention, the invention will now be described with reference to the following description of an embodiment taken in conjunction with the accompanying drawings.

The broad technique taught by the invention is the manipulation of high energy, very small wavelength electromagnetic radiation. While this manipulation is suitable for many uses, it is particularly applicable to further teachings of the invention which are directed to the creation of mask images.

The invention manipulates hard X-rays and gamma rays for useful purposes by collimating and convergently focusing beams of these rays. Although most of the principles which form the foundation for the invention, which are described below, refer to X-ray phenomena, the teachings of the invention are equally applicable to the shorter wavelength radiation of gamma rays. Hard X-rays are considered to be those X-rays having electrical energy in the range of from 1 to 100 keV. The invention utilizes crystals to perform the collimating and focusing functions. For convenience, for the purposes of describing the invention, the crystals are referred to as a collimating crystal and a focusing crystal.

The invention's utilization of crystals as manipulating lenses is based upon the X-ray diffractive-properties of crystals. In general, X-rays striking a crystal are absorbed by the crystal. However, the diffraction of X-rays occurs when they strike a crystal at a particular angle with respect to the lattice structure of the crystal. In such instances, the X-rays are passed through the crystal, exiting at a particular angle. This propagation through the crystal occurs because the rays are internally reflected by the latticework of the crystal. This phenomenon is known as the Bragg condition and is quantitatively expressed as Bragg's Law or the Bragg equation, namely, $$(n)(lambda) = 2(d) \sin b$$

where
n is an integer,
lambda is the wavelength of the X-ray,
d is the lattice constant, or distance between the reflecting layers of the crystal, and
b is the angle of incidence of the ray with respect to the lattice layer.

Figure 1:
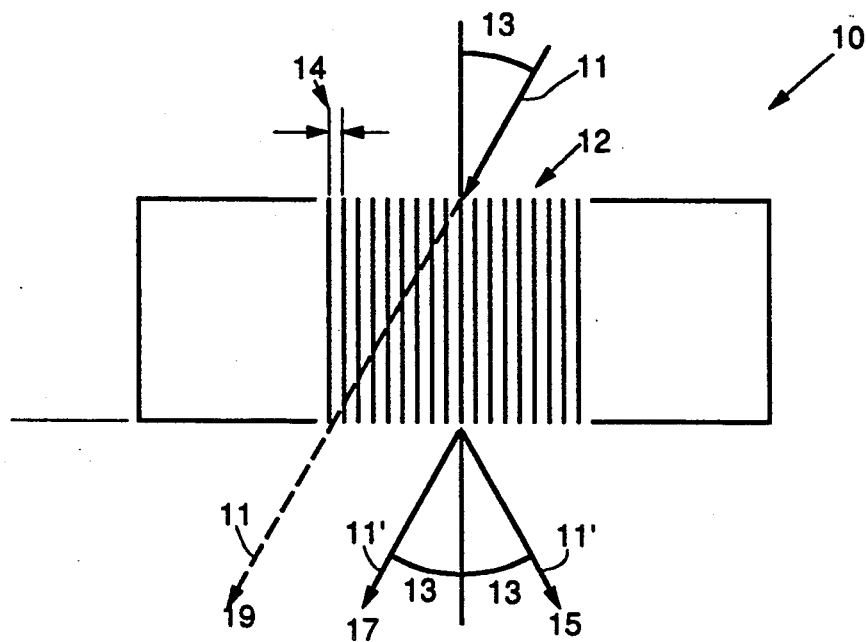
FIG. 1 is a representation of a crystal illustrating principles utilized in the teachings of the invention.

Reference is now made to FIG. 1 in which the operation of the collimating crystal 10 employing the diffraction phenomenon is illustrated. The collimating crystal 10 utilizes the Borrmann effect caused by the Bragg condition in crystals to project a beam of hard X-rays or gamma rays from a diffuse ray source. The Borrmann effect in crystals is also known as anomalous transmission. When the Bragg condition, that is the Bragg equation, is satisfied in dislocation-free crystals, the Borrmann effect is manifested as a drastic reduction (for example by a factor of 200) of the absorption coefficient. A reduction in the absorption coefficient means that more of the electromagnetic energy exits the crystal. The term "dislocation-free" refers to the absence of "dislocations" in the lattice structure. Dislocations are imperfections in the lattice that alter the geometric structure and adversely affect energy propagation therethrough. In FIG. 1, an incident ray 11 is shown entering the crystal 10 at an angle of incidence 13, or b, with respect to the lattice planes or layers 12 of the crystal 10. The lattice layers 12 are separated by the distance referred to above as the lattice constant or lattice spacing d or 14. When the Bragg condition is satisfied, the angle of incidence b, or 13, may also be referred to as the Bragg angle. The Borrmann effect is demonstrated by the transmission of beams shown in positions 15, 17 and 19. The transmitted radiation is split into two equal intensity parts separated by the angle $2a$. Beams at positions 15 and 17 are the anomalously-transmitted radiation. Those positions are known as the rearward diffracted beam and forward diffracted beam, respectively. The third component 19 is unaltered transmitted radiation. It is weak compared with the anomalously transmitted radiation. The angular width of the Borrmann effect is about $10^{-5}$ radians, or about one arc second. Therefore, the anomalous transmission of hard X-rays or gamma rays through a dislocation free crystal produces a very well collimated beam of radiation 11'.

The above principles and phenomena are also utilized in the teachings of the invention directed to focusing hard X-rays and gamma rays. The teachings directed to the use of a focusing crystal are based upon a further phenomenon associated with the above Borrmann and Bragg principles, namely, that when a crystal is distorted the propagated X-radiation may produce a converging or diverging beam. The mechanical flexing of a crystal produces a cylindrically-focused beam. The crystal lattice ma also be distorted by heating one end and cooling the other end of the crystal, or by mechanical force, such as the application of radial force on one end of the crystal. For a crystal 10 cm in length, the effects produced would be small, that is, approximately $10^{-3}$ radians for a pressure of 1,000 atmospheres applied to one end of the crystal, or $10^{-4}$ radians for a 400 degree temperature difference along the crystal. Another effective way to convergently or divergently focus short wavelength radiation is to produce a crystal with a varying lattice constant, or spacing between planes.

Figure 2:
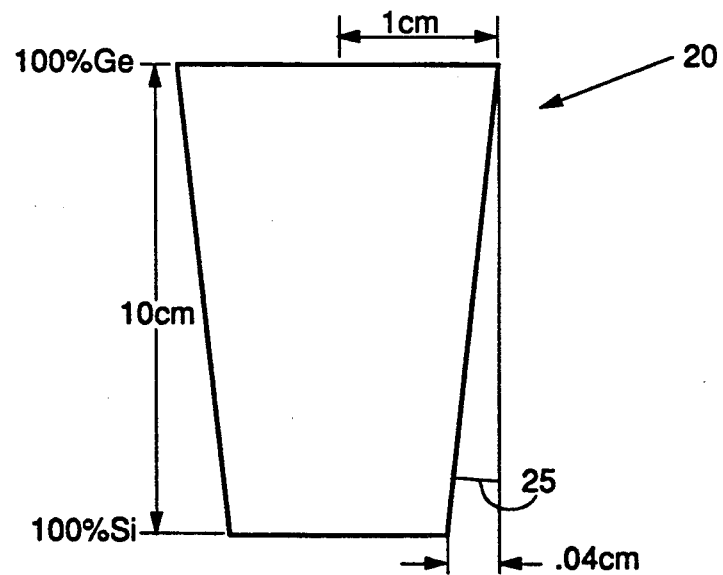
FIG. 2 is a representation of a composite-substance crystal illustrating teachings of the invention.

Referring now to FIG. 2, therein is represented an example of a focusing crystal 20 which has a varying lattice constant over its length. Radiation entering a focusing crystal 20 according to the teachings herein emerges as either a diverging beam of radiation or a converging beam of radiation. The crystal 20 shown tapers from top to bottom, representing a decreasing lattice constant from top to bottom. Properly aligned radiation entering the top exits as a converging beam. Conversely, radiation entering the top of a crystal which tapers from bottom to top produces a diverging beam. The teachings of the invention may be illustrated using the substances silicon and germanium. The lattice constant of silicon is 5.43 Angstroms and the lattice constant of germanium is 5.66 Angstroms. Solid state solubility of germanium in silicon covers the complete range from 0% germanium to 100% germanium. In FIG. 1, the top of the crystal is represented as being composed of 100% germanium and, thus, 0% silicon. The bottom of the crystal is represented as being composed of 100% silicon, and, thus, 0% germanium. The concentration proportions vary continuously over the length of the crystal 20. By growing a crystal with a continuously varying concentration of silicon in germanium, the lattice constant varies by about 4%. If the crystal 20 has a linear concentration gradient of about 4% per cm, over the length of 10 cm the dimension of the crystal lattice would decrease by about 0.04 cm. This would result in a convergence angle 25 of $0.04/10 = 4$ milliradians. The crystal 20 thus has a focal length f of $1/0.004 = 250$ cm. The diffraction limited size of the focal spot (at 250 cm) is given by the diffraction equation:

$$s = \frac{(1.22)(\text{lambda})}{D} f,$$

where s is the diameter of the focal spot, 1.22 represents a proportionality constant, D is the diameter of the end of the crystal 20 which first receives radiation, lambda is the wavelength of radiation and f is the focal length. The following example illustrates the applicability of these teachings. 60 keV gamma rays from the decay of $Am^{241}$ have a wavelength (lambda) of 0.17 Angstroms. The size of the focal spot for the crystal 20 illustrated having a diameter D of 2 cm would then be:

$$s = \frac{1.22 \times 1.7 \times 10^{-9}}{2} \times 250$$
$$= 26 \times 10^{-8} \text{ cm}$$

This would be the typical size accuracy or definition of a nanoelectronic feature. Therefore, the focusing crystal 20 could be used to extend the range of lithography for electronics down into the nanometer range.

Figure 3:
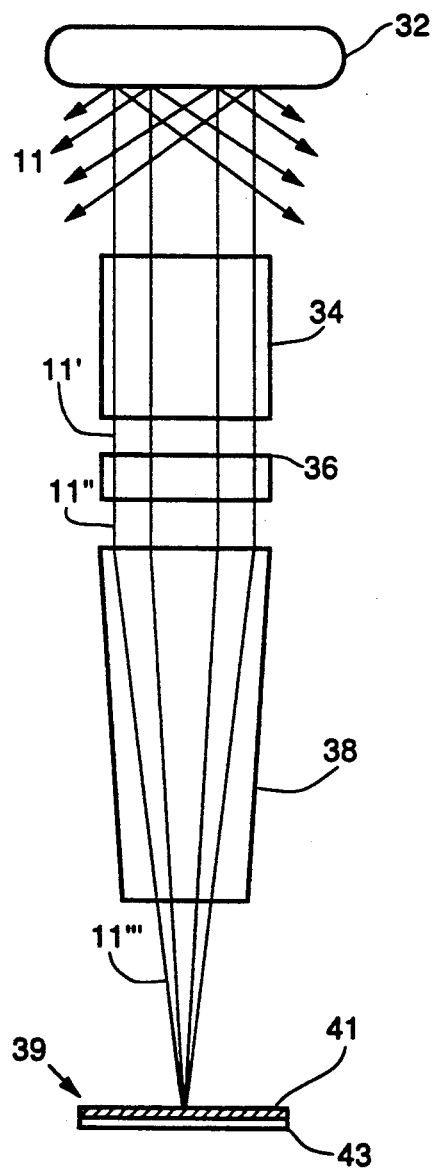
FIG. 3 is a schematic representation of an apparatus and method for convergently focusing hard X-rays or gamma rays to project a reduced mask image embodying teachings of the present invention.

Referring now to FIG. 3, therein is schematically illustrated an apparatus for convergently focusing hard X-rays and gamma rays 30 in accordance with the teachings of the invention. A diffuse ray source 32 emits diffuse hard X-ray or gamma ray beams 11. A collimating crystal 34, operating like the collimating crystal 10 described above propagates a collimated hard X-ray or gamma ray beam 11'. A mask 36 defining the circuit pattern which is to placed upon a chip is positioned to receive the collimated beam 11'. The collimated radiation 11" which exits the mask now carries the image of the mask 36. The collimated beam 11" enters the focusing crystal 38. The focusing crystal 38 is a composite crystal having a lattice constant which decreases over the length of the crystal 38. A converging beam 11''', carrying the image of the mask, exits the focusing crystal 38. A wafer 39 which is to be manufactured into semiconductor chips is placed in the path of the converging beam 11'''. The image of the mask which strikes the wafer 39 is a reduced version of the image which enters the focusing crystal 38 because of the convergence of the carrying radiation beam 11'''. The reduced image irradiates the photosensitive layer 41 of the wafer 39 which is supported by a substrate 43. Conventional chip production methods may then be used to produce integrated circuits having the degree of miniaturization and definition made possible by the invention.

The focusing crystal 20 or 38 can also receive radiation at its narrow, or smaller-lattice-structure, end. Radiation exiting the crystal 20 or 38 would then be diverging because of the dynamics described above.

As stated above, the lattice constant may be made to vary by several methods; however, the use of a composite-substance crystal is a simple, practical method.

As should be apparent from the foregoing specification, the invention is susceptible of being modified with various alterations and modifications which may differ from those which have been described in the preceding specification and description. Accordingly, the following claims are intended to cover all alterations and modifications which do not depart from the spirit and scope of the invention.

What is claimed is:

1. An apparatus for forming an image comprising:
   a first substantially dislocation-free crystal having a constant lattice constant over a length thereof for receiving and collimating hard X-ray or gamma ray radiation;
   image forming means aligned with said first crystal for receiving the collimated radiation and for providing an image therefrom; and
   a second substantially disclocation-free crystal spatially aligned with said image means and having a lattice constant that decreases over a length thereof for receiving said collimated hard X-ray or gamma ray image and for propagating and converging said collimated hard X-ray or gamma ray image along said length thereof to focus said hard X-ray or gamma ray image.

2. The invention of claim 1, wherein said first dislocation-free crystal comprises a disclocation-free single-substance crystal.

3. The invention of claim 1, wherein said second dislocation-free crystal comprises a dislocation-free composite-substance crystal.

4. The invention of claim 3, wherein said second dislocation-free composite-substance crystal comprises a dislocation-free crystal composed of at least two crystalline substances with a linearly continuously-varying concentration of one of said at least two crystalline substances in another of said at least two crystalline substances.

5. The invention of claim 3, wherein said second dislocation-free composite-substance crystal comprises a dislocation-free crystal with a linearly continuously-varying concentration of silicon in germanium.

6. The invention of claim 3, wherein said second dislocation-free composite-substance crystal comprises a dislocation-free silicon-germanium crystal wherein the proportion of germanium to silicon varies over a length of said silicon germanium crystal from about 100 percent germanium to about 100 percent silicon.

7. The invention of claim 1, wherein said second dislocation-free crystal is aligned so that said collimated hard X-ray or gamma ray image is received by a first end of said second dislocation-free crystal that has a greater lattice constant than a second exit end thereof.

8. The invention of claim 1, further comprising means for projecting diffuse hard X-ray or gamma ray radiation upon said first dislocation-free crystal.

9. The invention of claim 1, wherein said image means includes a mask interposed between said first dislocation-free crystal and said second dislocation-free crystal.

10. The invention of claim 1, further comprising means for positioning a surface to receive said focussed image which exits said second dislocation-free crystal.

11. An apparatus for projecting an image defined by a mask onto a surface comprising:
    a first substantially dislocation-free single-substance crystal;
    means for projecting diffuse hard X-ray or gamma ray radiation upon said dislocation-free single-substance crystal;
    a second substantially dislocation-free composite-substance crystal having a linearly-varying lattice constant along a length thereof, said mask interposed between said first and second crystals, said second crystal having a first end thereof for receiving said hard X-ray or gamma ray radiation, and a second end from which said hard X-ray or gamma ray radiation exits said second crystal, said first end having a lattice constant which is greater than a lattice constant of the second end;
    means for interposing the mask between said dislocation-free single-substance crystal and said dislocation-free composite substance crystal; and
    means for positioning the surface in a path of said hard X-ray or gamma ray radiation which exit said dislocation-free composite substance crystal.

12. A method for convergently focusing a hard X-ray image or gamma ray image onto a surface comprising:
    directing diffuse hard X-ray or gamma ray radiation through a first substantially dislocation-free single-substance crystal to produce a collimated hard X-ray beam or gamma ray beam;
    directing said collimated hard X-ray beam or gamma ray beam upon a second substantially dislocation-free composite-substance crystal having a lattice constant which decreases over a length thereof from a first end having a first lattice constant to a second end thereof having a second lattice constant whereby said surface receives said focussed hard X-ray or gamma ray beam, wherein said collimated hard X-ray beam or gamma ray beam is directed upon said first end and exits said second end;
    interposing a mask between said first dislocation-free crystal and said second dislocation-free crystal to provide a hard X-ray or gamma ray image to said second crystal; and
    positioning the surface in the path of radiation which exits said second end of said dislocation-free composite-substance crystal.

13. An apparatus for focusing hard X-rays or gamma rays comprising a crystal formed according to parameters to produce a lattice constant which decreases over a length thereof to create a focal spot having a diameter s at a focal length f defined in the equation $$s = \frac{(1.22)(\text{lambda})}{D} f,$$

where s is the diameter of the focal spot, 1.22 represents a proportionality constant, D is a diameter of an end of said crystal which receives the hard X-rays or gamma rays, lambda is a wavelength of the hard X-ray or gamma rays and f is the focal length of said crystal.

14. A system for manufacturing an article comprising:

means for providing collimated hard X-ray or gamma ray radiation;

crystal means for receiving and focussing said radiation to provide focussed hard X-ray or gamma ray radiation; and means for using said focussed radiation to manufacture an article; wherein said crystal means comprises a crystal having a first end and a second end distanced by a length of said crystal means, said crystal means having a lattice constant that decreases over said length, and said crystal means for receiving said hard x-ray or gamma ray radiation and converging said radiation as said radiation propagates from said first end to said second end over said length to provide focussed hard x-ray or gamma ray radiation.

15. An apparatus for focussing hard X-ray or gamma ray radiation, said apparatus including:

a crystal having a first end and a second end distanced by a length of said crystal, said crystal having a lattice constant that decreases over said length for receiving said hard X-ray or gamma ray radiation and converging said radiation as said radiation propagates from said first end to said second end over said length to provide focussed hard X-ray or gamma ray radiation.

16. The apparatus of claim 15 wherein said crystal is substantially dislocation-free.

17. The apparatus of claim 16 wherein said crystal includes at least two substances, wherein one substance varies from a high concentration to a substantially lower concentration over the length of said crystal.

* * * * *